United States Patent
Kim et al.

(10) Patent No.: US 7,800,941 B2
(45) Date of Patent: Sep. 21, 2010

(54) MAGNETIC MEMORY WITH MAGNETIC TUNNEL JUNCTION CELL SETS

(75) Inventors: Young Pil Kim, Eden Prairie, MN (US); Chulmin Jung, Eden Prairie, MN (US); Hyung-Kew Lee, Edina, MN (US); Insik Jin, Eagan, MN (US); Michael Xuefei Tang, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 149 days.

(21) Appl. No.: 12/272,896

(22) Filed: Nov. 18, 2008

(65) Prior Publication Data

US 2010/0124106 A1     May 20, 2010

(51) Int. Cl.
    *G11C 11/15* (2006.01)
(52) U.S. Cl. .......................... 365/171; 365/55; 365/66; 365/148
(58) Field of Classification Search .............. 365/55, 365/66
    See application file for complete search history.

(56) References Cited

U.S. PATENT DOCUMENTS

| | | | |
|---|---|---|---|
| 7,142,447 B2 * | 11/2006 | Ueda et al. ................ | 365/158 |
| 7,233,537 B2 | 6/2007 | Tanizaki | |
| 7,286,395 B2 | 10/2007 | Chen | |
| 7,295,460 B2 * | 11/2007 | Ezaki et al. ................ | 365/158 |
| 7,379,327 B2 | 5/2008 | Chen | |
| 7,502,249 B1 | 3/2009 | Ding | |
| 7,515,457 B2 | 4/2009 | Chen | |
| 2007/0007536 A1 | 1/2007 | Hidaka | |
| 2008/0273380 A1 | 11/2008 | Diao | |
| 2008/0310213 A1 | 12/2008 | Chen | |
| 2009/0040855 A1 | 2/2009 | Luo | |
| 2009/0185410 A1 | 7/2009 | Huai | |

OTHER PUBLICATIONS

U.S. Appl. No. 12/212,798, filed Sep. 18, 2008, Inventor: Hongyue Liu.

* cited by examiner

*Primary Examiner*—Tan T. Nguyen
(74) *Attorney, Agent, or Firm*—Campbell Nelson Whipps LLC

(57) ABSTRACT

A memory apparatus having at least one memory cell set comprising a first spin torque memory cell electrically connected in series to a second spin torque memory cell, with each spin torque memory cell configured to switch between a high resistance state and a low resistance state. The memory cell set itself is configured to switch between a high resistance state and a low resistance state. The memory apparatus also has at least one reference cell set comprising a third spin torque memory cell electrically connected in anti-series to a fourth spin torque memory cell, with each spin torque memory cell configured to switch between a high resistance state and a low resistance state. The reference cell set itself has a reference resistance that is a midpoint of the high resistance state and the low resistance state of the memory cell set.

20 Claims, 6 Drawing Sheets

US 7,800,941 B2

MAGNETIC MEMORY WITH MAGNETIC TUNNEL JUNCTION CELL SETS

BACKGROUND

Spin torque transfer technology, also referred to as spin electronics, which is based on changing magnetic state of the system by momentum transfer from conduction electrons, is a recent development. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation, and a non-magnetic barrier layer therebetween. The magnetization orientations of the free layer and the pinned layer define the resistance of the overall magnetic element. One particular type of such elements is what is referred to as a "spin tunneling junction," "magnetic tunnel junction cell", "spin torque memory cell", and the like. When the magnetization orientations of the free layer and pinned layer are parallel, the resistance of the element is low ($R_L$). When the magnetization orientations of the free layer and the pinned layer are antiparallel, the resistance of the element is high ($R_H$). The magnetization orientation is switched by passing a current either parallel across the layers or perpendicularly through the layers.

At least because of their small size, it is desirous to use magnetic tunnel junction cell elements in many applications, such as random access memory, often referred to as spin torque RAM or ST RAM. ST RAM, however, may have issues during reading or sensing operations due to its relative low $R_H$ to $R_L$ ratio. Therefore a need exists to improve reading or sensing systems in ST RAM applications.

BRIEF SUMMARY

The present disclosure relates to memory arrays that utilize a well defined reference resistance value and that have an increased design window for the resistance states $R_H$ and $R_L$. The spin torque-based magnetic memory of this disclosure includes at least one set of anti-series magnetic tunnel junction cells or variable resistive memory cells that provide the reference resistance value and at least one set of series magnetic tunnel junction cells or variable resistive memory cells that provide the data state, where a set of magnetic tunnel junction cells has two connected magnetic tunnel junction cells.

In one particular embodiment, a magnetic memory apparatus is provided, the memory apparatus having at least one memory cell set comprising a first spin torque memory cell electrically connected to a second spin torque memory cell, with each spin torque memory cell configured to switch between a high resistance state and a low resistance state. The memory cell set itself is configured to switch between a high resistance state and a low resistance state. The memory cell set is electrically between and connected to a first bit line and a first source line. The memory apparatus also has at least one reference cell set comprising a third spin torque memory cell electrically connected to a fourth spin torque memory cell, with each spin torque memory cell configured to switch between a high resistance state and a low resistance state. The reference cell set itself has a reference resistance. The reference cell set is electrically between and connected to a reference line and the first source line.

In another particular embodiment, a method is provided, the method of reading a memory array apparatus. The method includes passing a read current through a selected memory cell set comprising a first spin torque memory cell and a second spin torque memory cell, the memory cell set configured to switch between a high resistance state and a low resistance state. The method also includes passing the read current through a reference cell set comprising a third spin torque memory cell and a second spin torque memory cell and electrically connected to the selected memory cell set, the reference cell set configured to provide a reference resistance that is midpoint between the high resistance state and the low resistance state of the memory cell set. The resistance state of the selected memory cell set is compared with the reference resistance to determine the resistance state of the selected memory cell.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to memory arrays that include a variable resistive memory cell set that has a high resistance state and a low resistance state, and also include a reference cell set that provides a reference resistance for comparison to the high resistance state and the low resistance state. In memory arrays of this disclosure, the variable resistance memory cell set always has either a high resistance of 2 $R_H$ or a low resistance of 2 $R_L$, and the reference resistance is always $R_H+R_L$. The reference resistance provides a reliable reference on chip to compare to a read resistance of a selected memory cell set and to determine if the selected memory cell set is in the high resistance state or low resistance state.

These memory arrays are particularly suitable for use with spin-transfer torque memory cells and resolves many systematic issues related to generation of a reliable reference resistance or voltage drop. While the present disclosure is not so limited, an appreciation of various aspects of the disclosure will be gained through a discussion of the examples provided below.

Figure 1A:
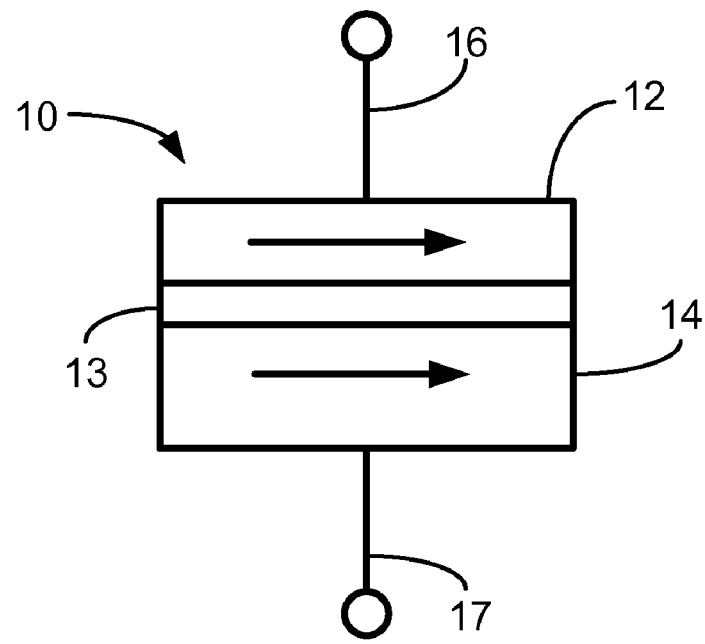
FIG. 1A is a cross-sectional schematic diagram of an illustrative magnetic tunnel junction cell in a low resistance state.
Figure 1B:
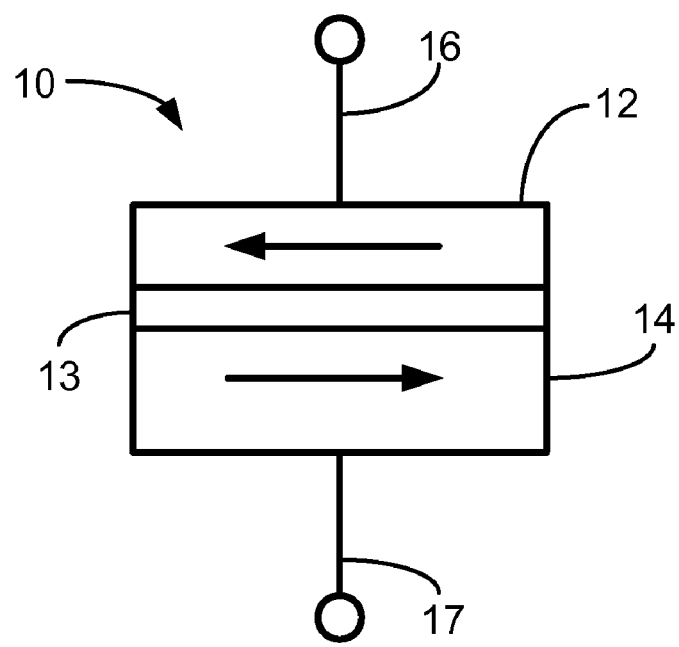
FIG. 1B is a cross-sectional schematic diagram of the magnetic tunnel junction cell in a high resistance state.

FIGS. 1A and 1B are a cross-sectional schematic diagram of a generic magnetic tunnel junction memory cell 10; in FIG. 1A, cell 10 is in the low resistance state, with the magnetization orientations parallel and in FIG. 1B, cell 10 is in the high resistance state, with the magnetization orientations anti-parallel. Magnetic tunnel junction memory cell 10 may also be referred to as a variable resistive memory cell or variable resistance memory cell.

Magnetic tunnel junction memory cell 10 includes a ferromagnetic free layer 12 and a ferromagnetic reference (i.e., pinned) layer 14. Ferromagnetic free layer 12 and ferromagnetic pinned layer 14 are separated by a non-magnetic material 13 which may serve as a barrier layer in the magnetic tunnel junction configuration. Non-magnetic layer 13 is configured to allow charge carriers (electrons) to tunnel between ferromagnetic pinned layer 14 and ferromagnetic free layer 12. Ferromagnetic layers 12, 14 may be made of any useful ferromagnetic (FM) material such as, for example, Fe, Co or Ni and alloys thereof, such as NiFe and CoFe. Either or both of free layer 12 and pinned layer 14 may be either a single layer or an unbalanced synthetic antiferromagnetic (SAF) coupled structure, i.e., two ferromagnetic sublayers separated by a metallic spacer, such as Ru or Cr, with the magnetization orientations of the sublayers in opposite directions to provide a net magnetization. Non-magnetic layer 13 may be made of an electrically insulating material such as, for example an oxide material (e.g., $Al_2O_3$, $TiO_x$ or MgO). Other suitable materials may also be used. Non-magnetic layer 13 could optionally be patterned with free layer 12 or with pinned layer 14, depending on process feasibility and device reliability.

The following are various specific examples of magnetic tunnel junction cells 10. In some embodiments of magnetic tunnel junction memory cell 10, oxide barrier layer 13 includes $Ta_2O_5$ (for example, at a thickness of about 0.5 to 1 nanometer) and ferromagnetic free layer 12 and a ferromagnetic pinned layer 14 include NiFe, CoFe, or Co. In other embodiments of magnetic tunnel junction memory cell 10, barrier layer 13 includes GaAs (for example, at a thickness of about 5 to 15 nanometers) and ferromagnetic free layer 12 and ferromagnetic pinned layer 14 include Fe. In yet other embodiments of magnetic tunnel junction memory cell 10, barrier layer 13 includes $Al_2O_3$ (for example, a few nanometers thick) and ferromagnetic free layer 12 and ferromagnetic pinned layer 14 include NiFe, CoFe, or Co. The dimensions of magnetic tunnel junction memory cell 10 are small, in the range of a few hundred nanometers in length and about 50 nm in width. The width is generally less than the length, so that magnetic tunnel junction memory cell 10 has some shape anisotropy, ensuring that free layer 12 has a preferred magnetization orientation.

A first electrode 16 is in electrical contact with ferromagnetic free layer 12 and a second electrode 17 is in electrical contact with ferromagnetic pinned layer 14. Electrodes 16, 17 electrically connect ferromagnetic layers 12, 14 to a control circuit providing read and write currents through layers 12, 14. The resistance across magnetic tunnel junction memory cell 10 is determined by the relative orientation of the magnetization vectors or magnetization orientations of ferromagnetic layers 12, 14. The magnetization direction of ferromagnetic pinned layer 14 is pinned in a predetermined direction while the magnetization direction of ferromagnetic free layer 12 is free to rotate under the influence of spin torque. One of the methods to achieve pinning of ferromagnetic pinned layer 14 is by exchange bias with an antiferromagnetically ordered material (AFM) such as PtMn, IrMn, and others.

FIG. 1A illustrates magnetic tunnel junction memory cell 10 in the low resistance state where the magnetization orientation of ferromagnetic free layer 12 is parallel and in the same direction of the magnetization orientation of ferromagnetic pinned layer 14. This is termed the low resistance state and can be chosen as one of two memory states, for example, the "0" data state. FIG. 1B illustrates magnetic tunnel junction memory cell 10 in the high resistance state where the magnetization orientation of ferromagnetic free layer 12 is anti-parallel and in the opposite direction of the magnetization orientation of ferromagnetic pinned layer 14. This is termed the high resistance state or the "1" data state.

Switching the resistance state and hence the data state of magnetic tunnel junction memory cell 10 via spin-transfer occurs when a current, under the influence of a magnetic layer of magnetic tunnel junction memory cell 10, becomes spin polarized and imparts a spin torque on free layer 12 of magnetic tunnel junction memory cell 10. When a sufficient level of polarized current and therefore spin torque is applied to free layer 12, the magnetization orientation of free layer 12 can be switched between two opposite directions and accordingly, magnetic tunnel junction memory cell 10 can be switched between the parallel state (i.e., low resistance state or "0" data state) and anti-parallel state (i.e., high resistance state or "1" data state).

The illustrative spin-transfer torque magnetic tunnel junction memory cell 10 is used to construct a memory device where a data bit is stored in the spin torque memory cell by changing the relative magnetization state of free layer 12 with respect to pinned layer 14. The stored data bit can be read out by measuring the resistance of cell 10 which changes with the magnetization direction of free layer 12 relative to pinned layer 14. In order for the spin-transfer torque magnetic tunnel junction memory cell 10 to have the characteristics of a non-volatile random access memory, free layer 12 exhibits thermal stability against random fluctuations so that the orientation of free layer 12 is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 2:
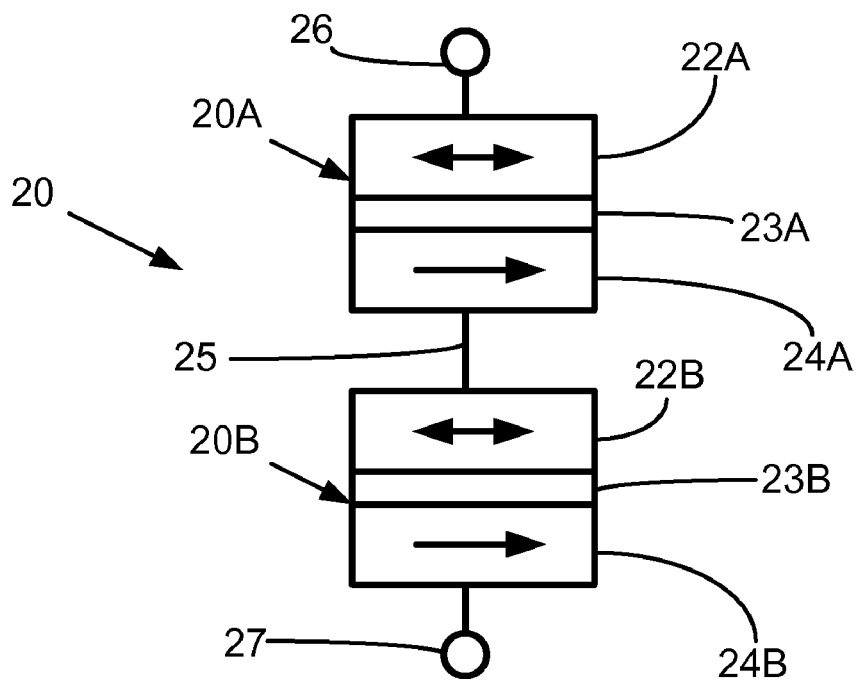
FIG. 2 is a cross-sectional schematic diagram of a first embodiment of a set of magnetic tunnel junction cells oriented in series.
Figure 3:
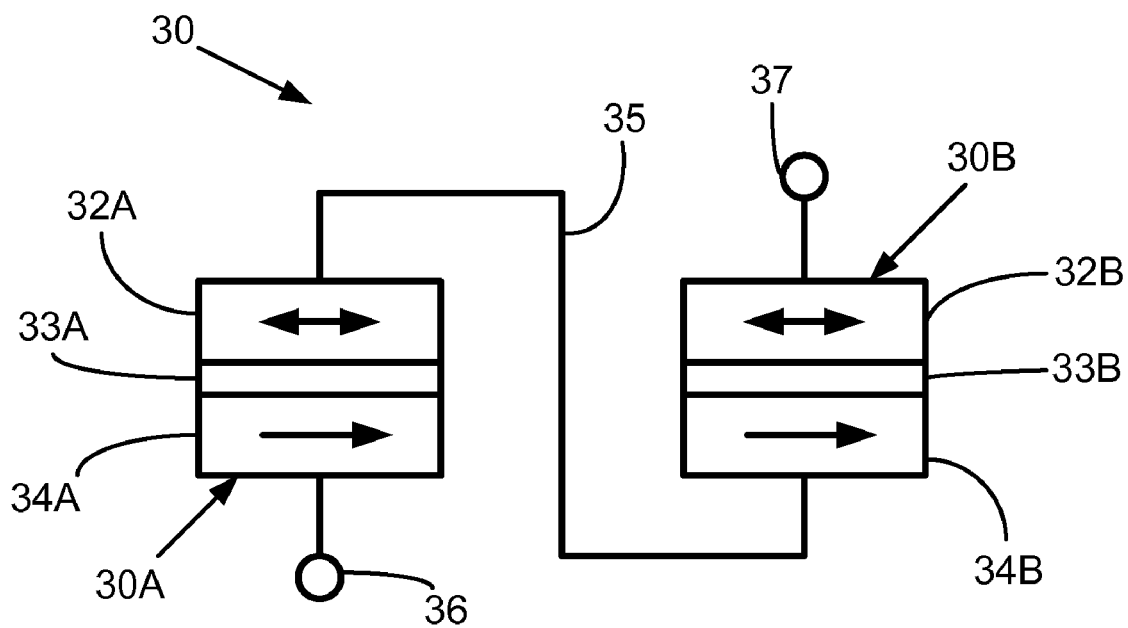
FIG. 3 is a cross-sectional schematic diagram of a second embodiment of a set of magnetic tunnel junction cells oriented in series.
Figure 4:
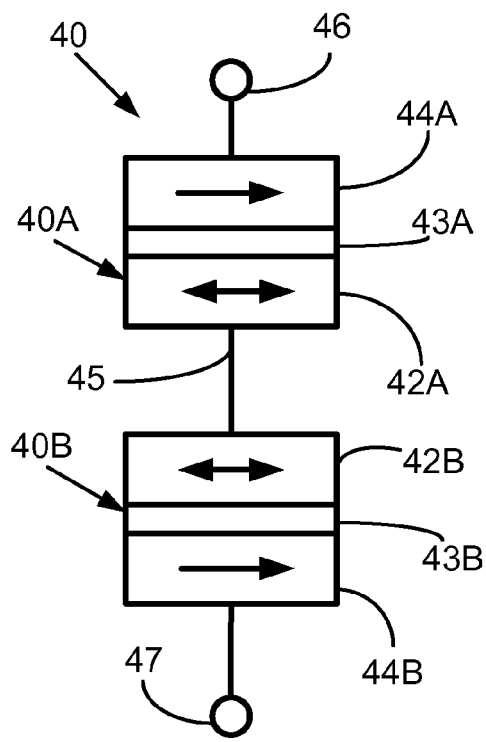
FIG. 4 is a cross-sectional schematic diagram of a first embodiment of a set of magnetic tunnel junction cells oriented in anti-series.
Figure 6:
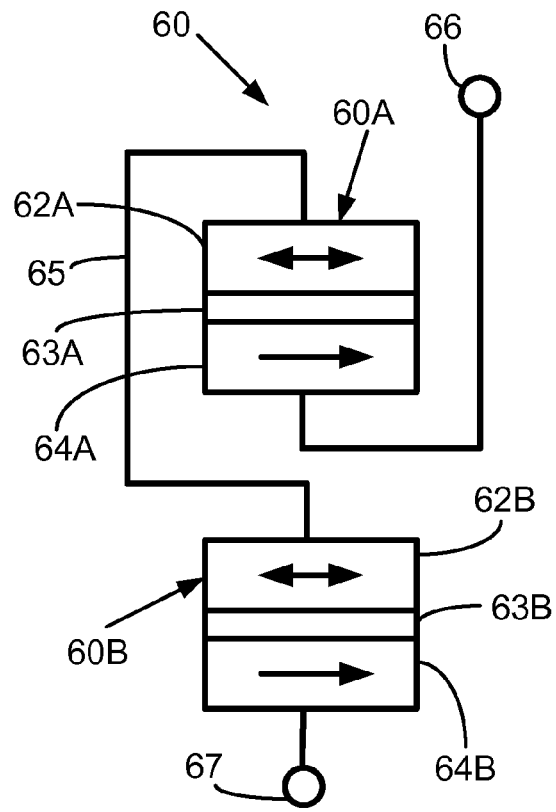
FIG. 6 is a cross-sectional schematic diagram of a third embodiment of a set of magnetic tunnel junction cells oriented in anti-series.
Figure 5:
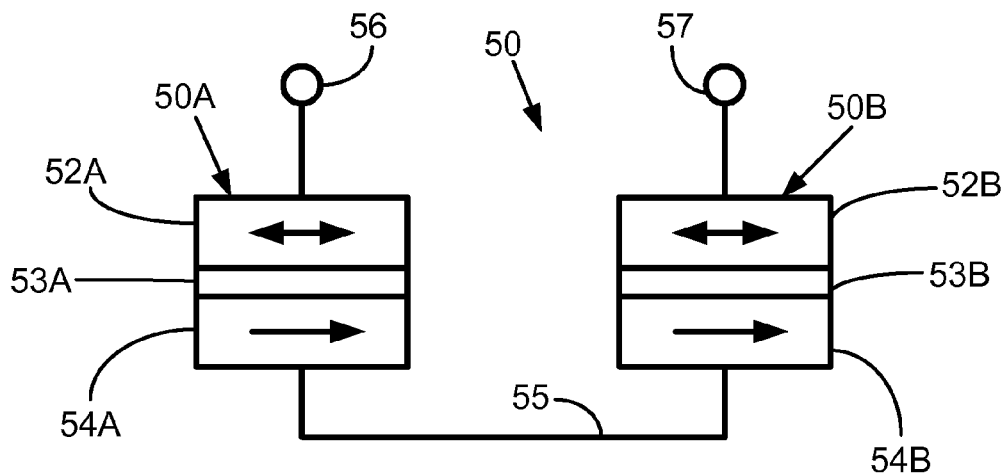
FIG. 5 is a cross-sectional schematic diagram of a second embodiment of a set of magnetic tunnel junction cells oriented in anti-series.

Two magnetic tunnel junction cells 10, and variations thereof, can be combined to form a variable resistive memory cell set. Depending on the orientation of one cell to the other, a set has the two cells either in series or anti-series. At least one set in series and at least one set in anti-series is used to create a memory array apparatus according to this disclosure. FIGS. 2 and 3 illustrate two embodiments of a set of cells in series and FIGS. 4, 5 and 6 illustrate three embodiments of a set of cells in anti-series. For a set of memory cells in series, a free layer from one cell is electrically connected to a pinned layer from the other cell. For a set of memory cells in anti-series, a free layer from one cell is electrically connected to a free layer from the other cell, or, a pinned layer from one cell is connected to a pinned layer from the other cell.

In FIG. 2, a variable resistive memory cell series set 20 is illustrated, having a first magnetic tunnel junction cell 20A and a second magnetic tunnel junction cell 20B. First cell 20A has a ferromagnetic free layer 22A, a ferromagnetic reference or pinned layer 24A, and a non-magnetic tunnel layer 23A therebetween. Similarly, second cell 20B has a ferromagnetic free layer 22B, a ferromagnetic reference or pinned layer 24B, and a non-magnetic tunnel layer 23B therebetween. First cell 20A and second cell 20B are identical, within manufacturing capabilities. First cell 20A and second cell 20B are electrically connected by a conducting line or metal interconnection 25. Interconnection 25 extends, in this embodiment, from pinned layer 24A of first cell 20A to free layer 22B of second cell 20B, so that a free layer is electrically connected to a pinned layer. Although FIG. 2 illustrates interconnection 25 as a line or wire, in some embodiments lead 25 may be a layer electrically connecting first cell 20A and second cell 20B. For memory cell set 20, cells 20A, 20B are on different levels and are made sequentially. Memory cell set 20 includes a first electrode 26 connected to free layer 22A of first cell 20A and a second electrode 27 connected to pinned layer 24B of second cell 20B. The total resistance across series set 20 is measured using electrodes 26, 27.

In FIG. 3, another variable resistive memory cell series set is illustrated as set 30, having a first magnetic tunnel junction cell 30A and a second magnetic tunnel junction cell 30B. First cell 30A has a ferromagnetic free layer 32A, a ferromagnetic reference or pinned layer 34A, and a non-magnetic tunnel layer 33A therebetween. Similarly, second cell 30B has a ferromagnetic free layer 32B, a ferromagnetic reference or pinned layer 34B, and a non-magnetic tunnel layer 33B therebetween. First cell 30A and second cell 30B are identical, within manufacturing capabilities. First cell 30A and second cell 30B are electrically connected by an interconnection 35. Interconnection 35 extends, in this embodiment, from free layer 32A of first cell 30A to pinned layer 34B of second cell 30B, so that a free layer is connected to a pinned layer. Cells 30A, 30B are formed in the same level during the manufacturing process. Memory cell set 30 includes a first electrode 36 connected to pinned layer 34A of first cell 30A and a second electrode 37 connected to free layer 32B of second cell 30B. The total resistance across series set 20 is measured using electrodes 26, 27.

For series sets 20, 30 of FIGS. 2 and 3, respectively, a current passed through the set in either direction will always provide a resistance of either $2R_H$ or $2R_L$. For example in set 20, if a current is passed from electrode 26 to electrode 27, the magnetization orientation of layers 22A, 24A will be parallel and the resistance across first cell 20A will be low ($R_L$), and the magnetization orientation of layers 22B, 24B will be parallel and the resistance across second cell 20B will be low ($R_L$). Thus, the total resistance is $R_L+R_L$, which is $2R_L$. If a current is passed the other direction from electrode 27 to electrode 26, the magnetization orientation of layers 22A, 24A will be antiparallel and the resistance across first cell 20A will be high ($R_H$), and the magnetization orientation of layers 22B, 24B will be antiparallel and the resistance across second cell 20B will be high ($R_H$). Thus, the total resistance is $R_H+R_H$, which is $2R_H$. The same holds for series set 30.

In FIG. 4, a resistive memory cell anti-series set 40 is illustrated, having a first magnetic tunnel junction cell 40A and a second magnetic tunnel junction cell 40B. First cell 40A has a ferromagnetic free layer 42A, a ferromagnetic reference or pinned layer 44A, and a non-magnetic tunnel layer 43A therebetween. Similarly, second cell 40B has a ferromagnetic free layer 42B, a ferromagnetic reference or pinned layer 44B, and a non-magnetic tunnel layer 43B therebetween. First cell 40A and second cell 40B are identical, within manufacturing capabilities. First cell 40A and second cell 40B are electrically connected by an interconnection 45. Interconnection 45 extends, in this embodiment, from free layer 42A of first cell 40A to free layer 42B of second cell 40B, so that a free layer is connected to a free layer. Cells 40A, 40B are on different levels and are made sequentially. Memory cell set 40 includes a first electrode 46 connected to pinned layer 44A of first cell 40A and a second electrode 47 connected to pinned layer 44B of second cell 40B. The total resistance across anti-series set 40 is measured using electrodes 46, 47.

In FIG. 5, another resistive memory cell anti-series set is illustrated as set 50, having a first magnetic tunnel junction cell 50A and a second magnetic tunnel junction cell 50B. First cell 50A has a ferromagnetic free layer 52A, a ferromagnetic reference or pinned layer 54A, and a non-magnetic tunnel layer 53A therebetween. Similarly, second cell 50B has a ferromagnetic free layer 52B, a ferromagnetic reference or pinned layer 54B, and a non-magnetic tunnel layer 53B therebetween. First cell 50A and second cell 50B are identical, within manufacturing capabilities. First cell 50A and second cell 50B are electrically connected by an interconnection 55. Interconnection 55 extends, in this embodiment, from pinned layer 54A of first cell 50A to pinned layer 54B of second cell 50B, so that a pinned layer is connected to a pinned layer. Cells 50A, 50B are formed in the same level during the manufacturing process. Memory cell set 50 includes a first electrode 56 connected to free layer 52A of first cell 50A and a second electrode 57 connected to free layer 52B of second cell 50B. The total resistance across series set 50 is measured using electrodes 56, 57.

Yet another resistive memory cell anti-series set is illustrated as set 60 in FIG. 6, having a first magnetic tunnel junction cell 60A and a second magnetic tunnel junction cell 60B. First cell 60A has a ferromagnetic free layer 62A, a ferromagnetic reference or pinned layer 64A, and a non-magnetic tunnel layer 63A therebetween. Similarly, second cell 60B has a ferromagnetic free layer 62B, a ferromagnetic reference or pinned layer 64B, and a non-magnetic tunnel layer 63B therebetween. First cell 60A and second cell 60B are identical, within manufacturing capabilities. First cell 60A and second cell 60B are electrically connected by an interconnection 65. Interconnection 65 extends, in this embodiment, from free layer 62A of first cell 60A to free layer 62B of second cell 60B, so that a free layer is connected to a free layer. Cells 60A, 60B are on different levels and are made sequentially. Memory cell set 60 includes a first electrode 66 connected to pinned layer 64A of first cell 60A and a second electrode 67 connected to pinned layer 64B of second cell 60B. The total resistance across series set 60 is measured using electrodes 66, 67.

For anti-series sets 40, 50, 60 of FIGS. 4, 5 and 6, respectively, a current passed through the set in either direction will always provide a resistance of $R_H+R_L$. For example in set 40, if a current is passed from electrode 46 to electrode 47, the magnetization orientation of layers 42A, 44A will be antiparallel and the resistance across first cell 40A will be high ($R_H$), and the magnetization orientation of layers 42B, 44B will be parallel and the resistance across second cell 40B will be low ($R_L$). Thus, the total resistance is $R_H+R_L$. If a current is passed the other direction from electrode 47 to electrode 46, the magnetization orientation of layers 42A, 44A will be parallel and the resistance across first cell 40A will be low ($R_L$), and the magnetization orientation of layers 42B, 44B will be antiparallel and the resistance across second cell 40B will be high ($R_H$). Thus again, the total resistance is $R_H+R_L$. The same holds for anti-series sets 50, 60.

The resistance across an anti-series set, i.e., $R_H+R_L$, can be referred to as a reference resistance ($R_{REF}$) for a memory array that utilizes series sets and anti-series sets. This reference resistance will always be between the resistance from a series set (i.e., the memory cell set), which is always either $2R_H$ or $2R_L$, and, in many embodiments, this reference resistance of $R_H+R_L$ is the midpoint between $2R_H$ and $2R_L$.

A series set and an anti-series set, such as those described above, can be combined to form a memory array. In such a memory array, the series set is a memory cell set that stores a data point and the anti-series set is a reference set that provides a reference resistance value to confirm the value of the memory set resistance and thus the data point. Having the reference set on the same semiconductor chip as the memory cell facilitates comparison and obtaining the data output. Additionally, because a cell set includes two cells, the manufacturing variation among magnetic tunnel junction cell sets is decreased as compared to among individual magnetic tunnel junction cells, thus broadening the allowable variation parameters of each cell. For example, assuming random process variation is 7%, the variation of 1 kOhm ($\sigma_{1k}$) and 2 kOhm ($\sigma_{2k}$) resistors is about 70 Ohm and 140 Ohm, respectively ($\sigma_k$=70 Ohm, $\sigma_{2k}$=140 Ohm). However, the variation of a 2 kOhm resistor, as part of a series set, ($\sigma_{1k+1k}$) is the square root of sum of the two $\sigma_{1k}^2$ ($\sigma_{1k+1k}^2 = \sigma_{1k}^2 + \sigma_{1k}^2$), which is $\sqrt{(2 \times 70 \times 70)}$=99 Ohm. Although this exemplary embodiment has the magnetic tunnel junction cells on the same plane, an embodiment having stacked cells would have similar results.

Figure 7:
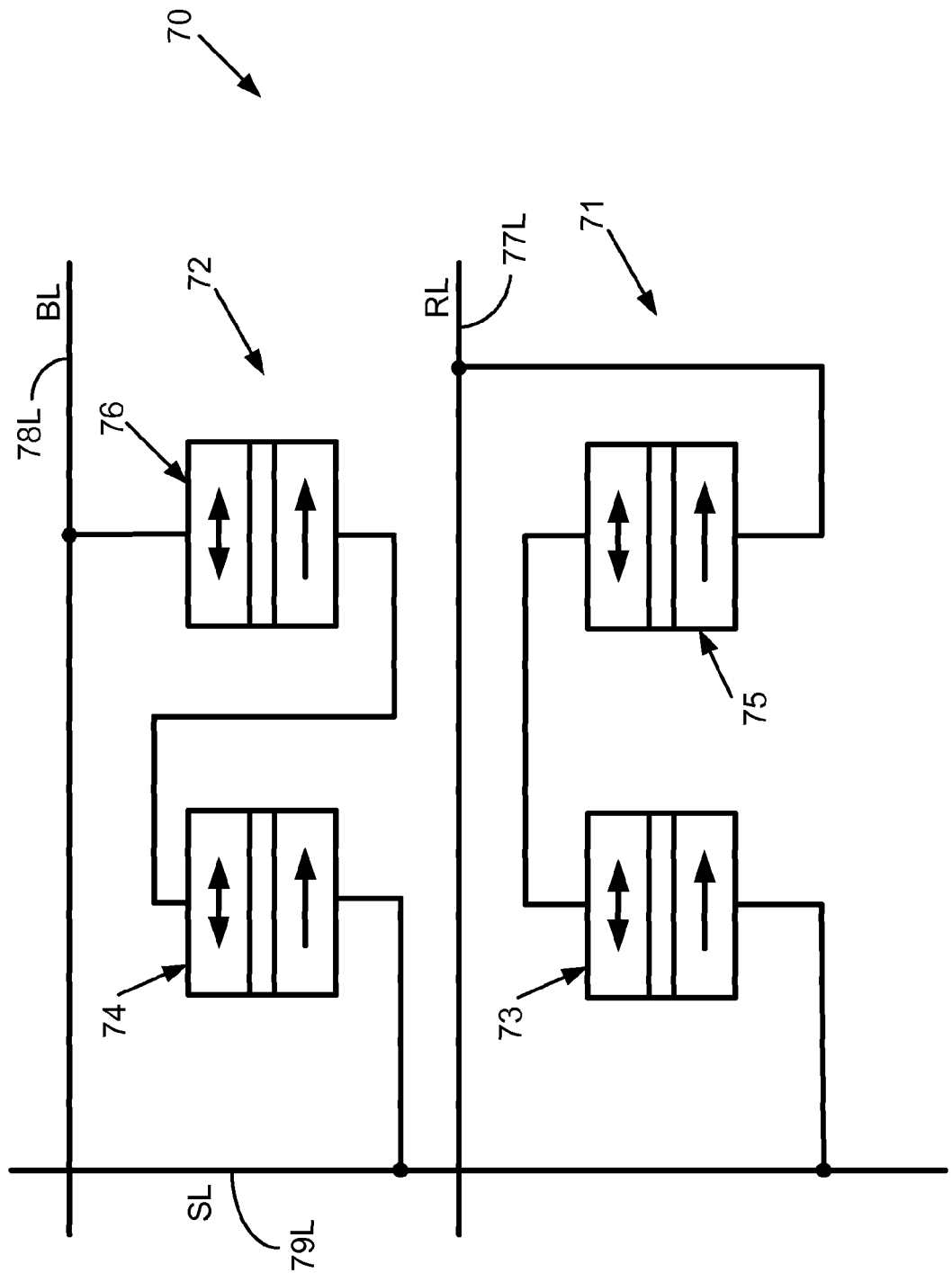
FIG. 7 is schematic diagram of a memory array having a set of magnetic tunnel junction cells in series and a set of magnetic tunnel junction cells in anti-series.

FIG. 7 is a schematic diagram of a memory array 70 having a reference resistance magnetic tunnel junction set and a variable resistance memory cell set, which provides a data point. The reference resistance set is an anti-series set, such as one of sets 40, 50, 60, described above, and the memory cell set is a series set, such as one of sets 20, 30, described above. Referring to FIG. 7, memory array 70 has a reference set 71 and a variable set 72. Reference set 71 has magnetic tunnel junction cell 73 in anti-series with magnetic tunnel junction cell 75. Variable set 72 has a magnetic tunnel junction cell 74 in series with magnetic tunnel junction cell 76. The anti-series reference set 71 and series variable set 72 are electrically interconnected via a network of lines. Reference cell set 71 is electrically connected to a reference line 77L and to a source line 79L. Variable cell set 72 is electrically conned to a bit line 78L and to source line 79L.

Figure 8:
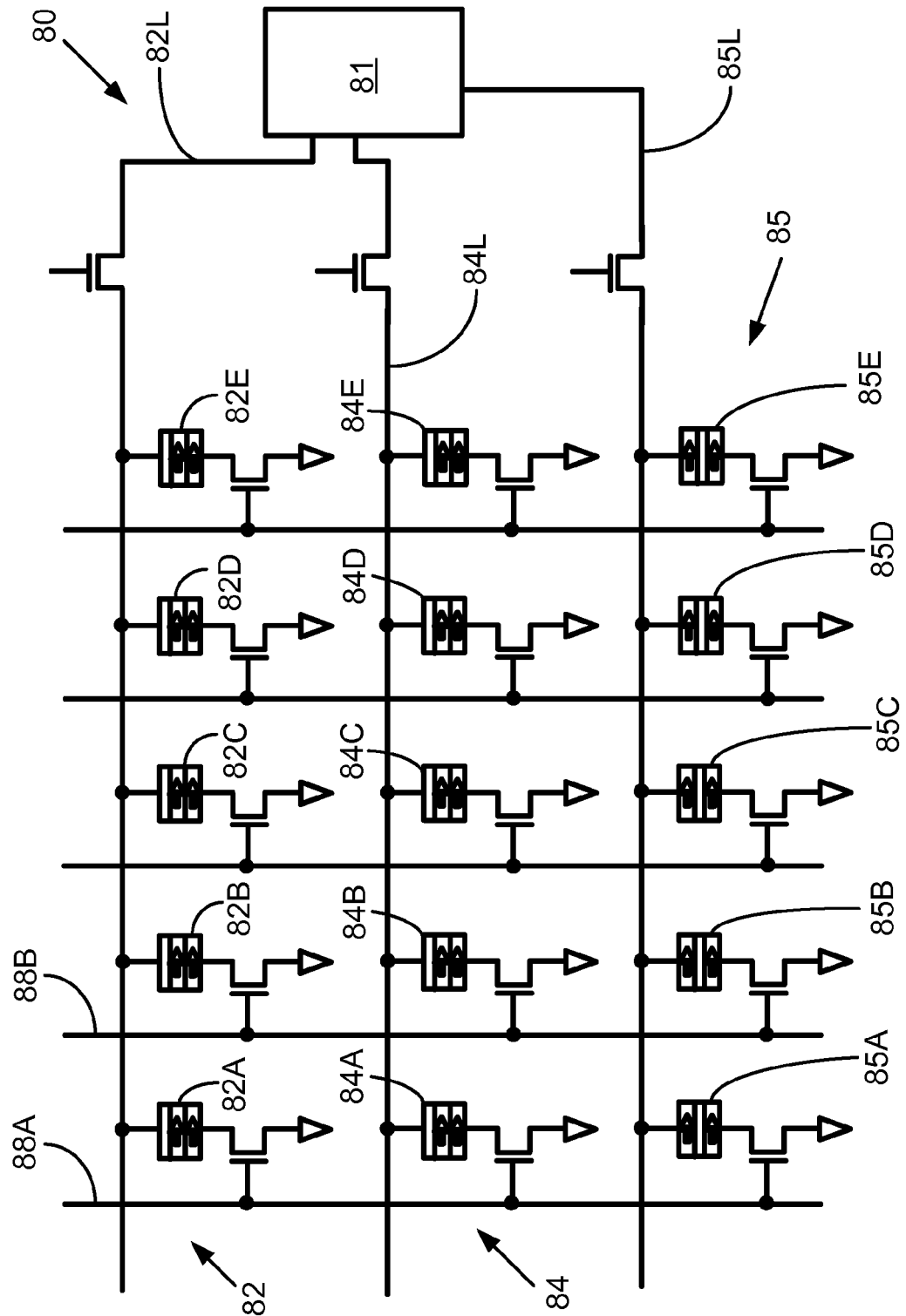
FIG. 8 is a schematic diagram of a memory array having a plurality of sets of magnetic tunnel junction cells in series and a plurality of sets of magnetic tunnel junction cells in anti-series.

FIG. 8 is a schematic diagram of a memory array 80 having at least one reference resistance magnetic tunnel junction set and at least one variable resistance memory cell set, which provides a data point. The reference resistance set is an anti-series set, such as one of sets 40, 50, 60, described above, and the memory cell set is a series set, such as one of sets 20, 30, described above. Referring to FIG. 8, memory array 80 has a first row 82 of series sets of magnetic tunnel junction cells and a second row 84 of series sets of magnetic tunnel junction cells, and a reference row 85 of anti-series sets of magnetic tunnel junction cells. In the illustrated memory array 80, each row has five cell sets, for example, first memory row 82 has first series set 82A, a second series set 82B, a third series set 82C, a fourth series set 82D, and a fifth series set 82E, second memory row 84 has first series set 84A, a second series set 84B, a third series set 84C, a fourth series set 84D, and a fifth series set 84E, and reference row 85 has first anti-series set 85A, a second anti-series set 85B, a third anti-series set 85C, a fourth anti-series set 85D, and a fifth anti-series set 85E. The number of memory set rows or rows of series sets could be two (as illustrated in FIG. 8), three, four, etc., up to several hundred for a reference set row or row of anti-series sets, depending on the design of the series sets, anti-series sets, and various features of the memory array.

The series memory sets and the anti-series references sets are electrically interconnected via a network of lines to a sense amplifier 81. In FIG. 8, each row of sets is connected by a line to a sense amplifier 81. For example, first memory row 82 is connected to sense amplifier 81 via bit line 82L, second memory row 84 is connected to sense amplifier 81 via bit line 84L, and reference row 85 is connected to sense amplifier 81 via reference line 85L. Additionally, each set (e.g., series set 82A) is connected to a source line for activating a transistor that is electrically connected to the set. For example, the first column of sets "A" (e.g., set 82A, 84A, 85A) is connected via source line 88A, the second column of sets "B" (e.g., set 82B, 84B, 85B) is connected via source line 88B, etc. In FIG. 8, the transistor for each set is electrically between the respective source line and the magnetic tunnel junction cell set; in other embodiments, the transistor is electrically between the bit line or reference line and the magnetic tunnel junction cell set.

Upon activation of the respective source line and bit line, the resistance value of a series memory set can be read. Upon activation of the reference line, the reference resistance set is activated and the resistance of the series memory set can be compared to the resistance of the corresponding anti-series reference set at sense amplifier 71.

Figure 9:
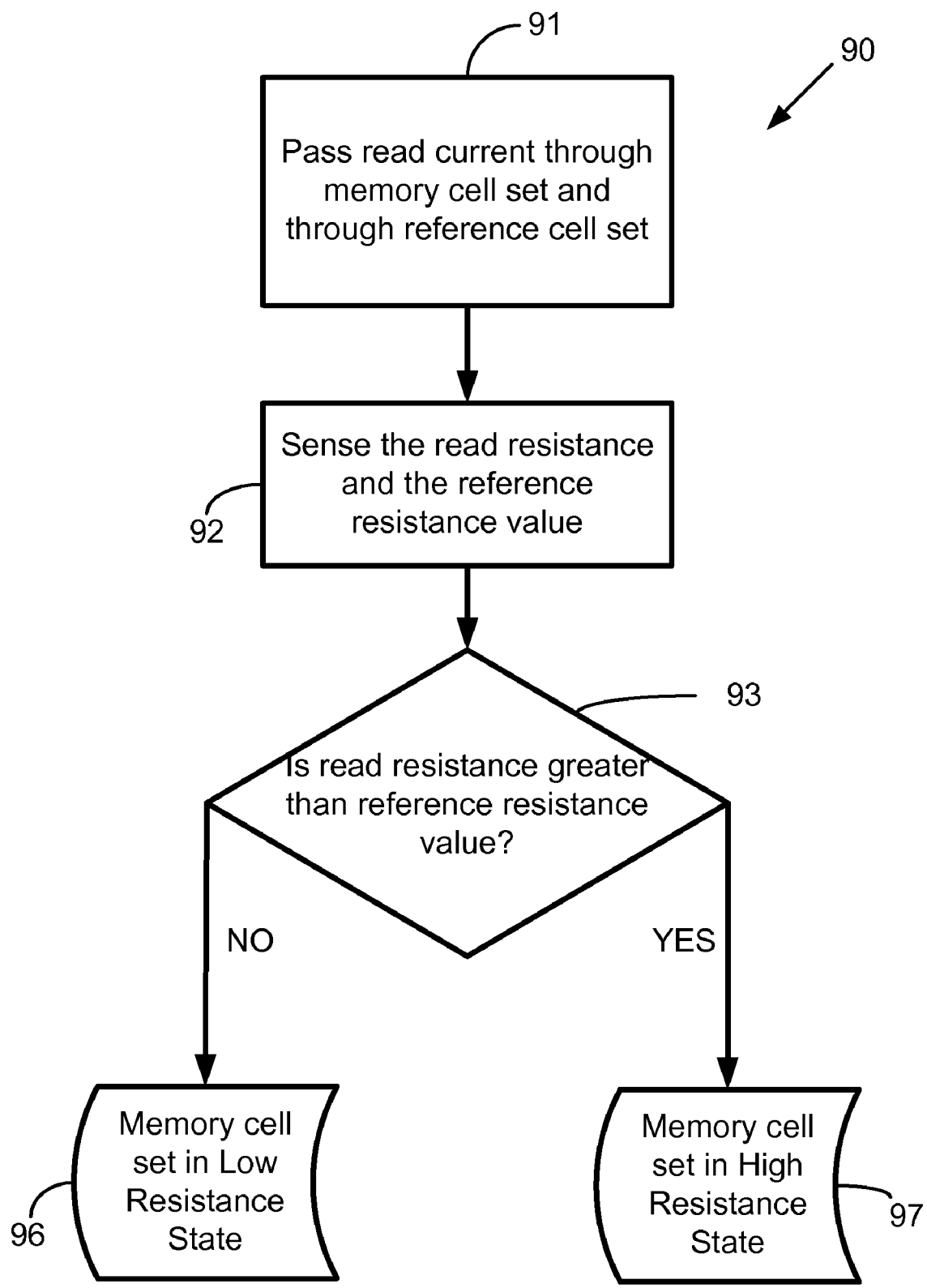
FIG. 9 is a flow diagram of an illustrative method of reading a memory array.

FIG. 9 is a flow diagram of an illustrative method 90 for reading a memory array apparatus, such as memory array apparatus 80 of FIG. 8. The method includes a step 91 of passing a read current through a selected variable resistive memory cell set (e.g., a set of magnetic tunnel junction cells in series) and passing the read current through a reference variable resistive memory cell set (e.g., a set of magnetic tunnel junction cells in anti-series) in a same row line as the selected variable resistive memory cell. The read current through the reference set may be at substantially the same time or a time different than the read current through the memory cell set. Additionally, the read current through the reference set may be the same current as that through the memory cell set. Then, the memory set resistance value and the reference resistance value are sensed at step 92. The memory resistance is then compared with the reference resistance value to determine the resistance state of the selected variable resistive memory cell at step 93. If the read resistance is less than the reference resistance value, then the memory cell is in the low resistance state, step 96. If the read resistance is greater than the reference resistance value, then the memory cell is in the high resistance state, step 97.

The spin torque magnetic tunnel junction cells, the cell sets, and memory array structures of this disclosure may be made by well-known thin film building and removal techniques such as chemical vapor deposition (CVD), physical vapor deposition (PVD), atomic layer deposition (ALD), photolithography, dry etching, wet etching, or ion milling. As discussed above, magnetic tunnel junction cells within a set may be formed on the same level or sequential levels. By combining series memory sets and anti-series reference sets in the same device (e.g., on the same chip), a reliable reference is provided to determine the resistance value of a selected memory cell set.

Thus, embodiments of the MAGNETIC MEMORY WITH MAGNETIC TUNNEL JUNCTION CELL SETS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

The use of numerical identifiers, such as "first", "second", etc. in the claims that follow is for purposes of identification and providing antecedent basis. Unless content clearly dictates otherwise, it should not be implied that a numerical identifier refers to the number of such elements required to be present in a device, system or apparatus. For example, if a device includes a first line, it should not be implied that a second line is required in that device.

What is claimed is:

1. A magnetic memory apparatus comprising:
    at least one memory cell set comprising a first spin torque memory cell electrically connected to a second spin torque memory cell, each spin torque memory cell configured to switch between a high resistance state and a low resistance state, and the memory cell set configured to switch between a high resistance state and a low resistance state, with the memory cell set electrically between and connected to a first bit line and a first source line; and
    at least one reference cell set comprising a third spin torque memory cell electrically connected to a fourth spin torque memory cell, each spin torque memory cell configured to switch between a high resistance state and a low resistance state, and the reference cell set having a reference resistance, with the reference cell set electrically between and connected to a reference line and the first source line.

2. The memory apparatus of claim 1 further comprising a second memory cell set comprising a fifth spin torque memory cell electrically connected to a sixth spin torque memory cell, each spin torque memory cell configured to switch between a high resistance state and a low resistance state, and the second memory cell set configured to switch between a high resistance state and a low resistance state, with the second memory cell set electrically between and connected to a second bit line and the first source line.

3. The memory apparatus of claim 1 wherein the first spin torque memory cell and the second spin torque memory cell are on a common plane.

4. The memory apparatus of claim 1 wherein the first spin torque memory cell and the second spin torque memory cell are on different planes in a stacked configuration.

5. The memory apparatus of claim 1 further comprising a first transistor electrically between the at least one memory cell set and the first source line, and a second transistor electrically between the at least one reference cell set and the first source line.

6. The memory apparatus of claim 1 further comprising a first transistor electrically between the at least one memory cell set and the first bit line, and a second transistor electrically between the at least one reference cell set and the reference line.

7. The memory apparatus of claim 1 wherein:
    the high resistance state of the at least one memory cell set is $2R_H$ and the low resistance state of the at least one memory cell set is $2R_L$; and
    the reference resistance of the at least one reference cell set is $R_H+R_L$.

8. A memory apparatus of claim 1, wherein the reference resistance is between the high resistance state of the at least one memory cell set and the low resistance state of the at least one memory cell set.

9. The memory apparatus of claim 1 wherein the first spin torque memory cell and the second spin torque memory cell have substantially the same structure.

10. The memory apparatus of claim 9 wherein the third spin torque memory cell and the fourth spin torque memory cell have substantially the same structure.

11. The memory apparatus of claim 1 wherein the first spin torque memory cell and the second spin torque memory cell are connected in series and the third spin torque memory cell and the fourth spin torque memory cell are connected in anti-series.

12. The memory apparatus of claim 1 wherein the first bit line and the reference line provide an output to a sense amplifier.

13. A magnetic memory apparatus comprising:
    at least one series cell set comprising a first spin torque memory cell electrically connected to a second spin torque memory cell, the series cell set configured to switch between a high resistance state and a low resistance state, with the series cell set electrically between and connected to a first bit line and a first source line; and
    at least one anti-series cell set comprising a third spin torque memory cell electrically connected to a fourth spin torque memory cell, the anti-series cell set having a reference resistance midpoint between the high resistance state of the at least one series cell set and the low resistance of the at least one series cell set, with the anti-series cell set electrically between and connected to a reference line and the first source line.

14. The memory apparatus of claim 13 further comprising a second series cell set comprising a fifth spin torque memory cell electrically connected to a sixth spin torque memory cell, each spin torque memory cell configured to switch between a high resistance state and a low resistance state, and the second series cell set configured to switch between a high resistance state and a low resistance state, with the second series cell set electrically between and connected to a second bit line and the first source line.

15. The memory apparatus of claim 13 wherein:
the high resistance state of the at least one series cell set is $2R_H$ and the low resistance state of the at least one series cell set is $2R_L$; and
the reference resistance of the at least one anti-series cell set is $R_H+R_L$.

16. The memory apparatus of claim 13 wherein the first spin torque memory cell, the second spin torque memory cell, the third spin torque memory cell and the fourth spin torque memory cell have substantially the same structure.

17. The memory apparatus of claim 13, wherein:
the first spin torque memory cell comprises a first ferromagnetic free layer, a first ferromagnetic pinned layer, and a first barrier layer therebetween;
the second spin torque memory cell comprises a second ferromagnetic free layer, a second ferromagnetic pinned layer, and a second barrier layer therebetween;
the third spin torque memory cell comprises a third ferromagnetic free layer, a third ferromagnetic pinned layer, and a third barrier layer therebetween;
the fourth spin torque memory cell comprises a fourth ferromagnetic free layer, a fourth ferromagnetic pinned layer, and a fourth barrier layer therebetween; and
wherein for the at least one series cell set, the first free layer is electrically connected to the second pinned layer, and for the at least one anti-series cell set, the third free layer is electrically connected to the fourth free layer, or, the third pinned layer is electrically connected to the fourth pinned layer.

18. The memory apparatus of claim 13 further comprising a first transistor electrically between the at least one series cell set and the first source line, and a second transistor electrically between the at least one anti-series cell set and the first source line.

19. A method of reading a memory array apparatus, comprising:
passing a read current through a selected memory cell set comprising a first spin torque memory cell and a second spin torque memory cell, the memory cell set configured to switch between a high resistance state and a low resistance state;
passing the read current through a reference cell set comprising a third spin torque memory cell and a second spin torque memory cell and electrically connected to the selected memory cell set, the reference cell set configured to provide a reference resistance that is between the high resistance state and the low resistance state of the memory cell set; and
comparing the resistance state of the selected memory cell set with the reference resistance to determine the resistance state of the selected memory cell set.

20. A method according to claim 19, wherein:
passing a read current through a selected memory cell set and passing the read current through a reference cell set comprises applying a current through a source line electrically connected to the memory cell set and the reference cell set, and
comparing the resistance state of the selected memory cell set with the reference resistance to determine the resistance state of the selected memory cell set comprises providing an output from the selected memory cell set and the reference cell set to a sense amplifier.

* * * * *